US010241173B2

(12) United States Patent
Zhao et al.

(10) Patent No.: US 10,241,173 B2
(45) Date of Patent: Mar. 26, 2019

(54) SYSTEMS AND METHODS FOR DESIGNING MAGNETIC RESONANCE FINGERPRINTING IMAGING PARAMETERS

(71) Applicant: The General Hospital Corporation, Boston, MA (US)

(72) Inventors: Bo Zhao, Malden, MA (US); Justin P. Haldar, Los Angeles, CA (US); Lawrence Wald, Cambridge, MA (US)

(73) Assignees: The General Hospital Corporation, Boston, MA (US); The University of Southern California, Los Angeles, CA (US)

( * ) Notice: Subject to any disclaimer, the term of this patent is extended or adjusted under 35 U.S.C. 154(b) by 213 days.

(21) Appl. No.: 15/450,127

(22) Filed: Mar. 6, 2017

(65) Prior Publication Data
US 2017/0261578 A1    Sep. 14, 2017

Related U.S. Application Data
(60) Provisional application No. 62/308,172, filed on Mar. 14, 2016.

(51) Int. Cl.
*G01V 3/00* (2006.01)
*G01R 33/50* (2006.01)
*G01R 33/56* (2006.01)

(52) U.S. Cl.
CPC .......... *G01R 33/50* (2013.01); *G01R 33/5608* (2013.01)

(58) Field of Classification Search
USPC ....................................................... 324/309
See application file for complete search history.

(56) References Cited

U.S. PATENT DOCUMENTS

| | | | | |
|---|---|---|---|---|
| 8,498,461 B2* | 7/2013 | Gross | ................. | G01R 33/4828 378/1 |
| 8,723,518 B2* | 5/2014 | Seiberlich | ............ | G01R 33/543 324/307 |
| 2015/0272467 A1* | 10/2015 | Warfield | ................ | A61B 5/055 382/131 |
| 2017/0205482 A1* | 7/2017 | Zhao | ....................... | G01R 33/50 |
| 2017/0234951 A1* | 8/2017 | Zhao | ....................... | G01R 33/50 324/309 |
| 2018/0136300 A1* | 5/2018 | De Rochefort | ........ | G01R 33/50 |
| 2018/0286041 A1* | 10/2018 | Hu | ........................ | G06T 11/008 |

* cited by examiner

*Primary Examiner* — Rodney E Fuller
(74) *Attorney, Agent, or Firm* — Quarles & Brady LLP

(57) ABSTRACT

Systems and methods for acquiring magnetic resonance fingerprinting (MRF) imaging data from a subject using a magnetic resonance imaging (MRI) system are provided. The method includes receiving an indication of an MRF imaging process to be performed by the MRI system and receiving a desired design objective for the MRF imaging process and a configuration metric associated with the MRF imaging process. The method further includes using the configuration metric to bound a variance of tissue parameter estimates associated with the MRF imaging process and determine imaging parameters that achieve the desired design objective. The method also includes performing the MRF imaging process using the determined imaging parameters to acquire MRF data using the MRI system.

18 Claims, 5 Drawing Sheets

SYSTEMS AND METHODS FOR DESIGNING MAGNETIC RESONANCE FINGERPRINTING IMAGING PARAMETERS

CROSS-REFERENCE TO RELATED APPLICATIONS

This application is based on, claims priority to, and incorporates herein by reference in its entirety U.S. Provisional Application Ser. No. 62/308,172, entitled "SYSTEMS AND METHODS FOR DESIGNING MAGNETIC RESONANCE FINGERPRINTING IMAGING PARAMETERS," and filed Mar. 14, 2016.

STATEMENT REGARDING FEDERALLY SPONSORED RESEARCH

This invention was made with government support under R01EB017219 and R01EB017337 awarded by the National Institutes of Health, and CCF-1350563 awarded by the National Science Foundation. The government has certain rights in the invention.

BACKGROUND

Magnetic resonance imaging ("MRI") is a technique that finds wide and diverse use in clinical medicine. Clinical applications of MRI generally utilize contrast-weighted MR images, which are complex functions of intrinsic tissue MR parameters, such as spin density, longitudinal and transverse relaxation times, and extrinsic imperfections arising from pulse sequences and hardware. These images are qualitative in nature, and often have limited sensitivity to tissue physiological and/or pathological variations. This hampers the effectiveness of applying MRI for early disease diagnosis, such as cancer.

Although the potential of quantitative imaging has long been recognized, pushing towards truly quantitative imaging faces a number of technical challenges. One key challenge is long acquisition time. In order to obtain accurate quantitative tissue properties, a long sequence of images with different contrast-weightings has to be acquired. This often results in prohibitively long acquisition times, especially for high-resolution imaging applications.

Until recently, MR imaging speed has been significantly improved by the development of rapid scan sequences and parallel imaging with phased array coils. This dramatically increases the number of measurements possible in clinically relevant scan times, including multiple measurements at different relaxation weightings. Forming relaxation parameter maps from these images moves MR imaging experiments from the qualitative domain to the quantitative domain.

Magnetic resonance fingerprinting ("MRF") is an imaging technique that enables quantitative mapping of tissue or other material properties based on random or pseudorandom measurements of the subject or object being imaged. In this context, "random" or "pseudorandom" measurements are achieved by performing an MRF pulse sequence formed by a series of "sequence blocks" that have differing acquisitions parameters between "sequence blocks," such as differing flip angles, repetition times, echo times, and the like, as explained below. Using these variable sequence blocks, MRF enables simultaneous acquisition of multiple tissue-specific parameters and system-specific parameters at an ultrafast speed. Examples of tissue parameters that can be mapped include longitudinal relaxation time ($T_1$), transverse relaxation time ($T_2$), and spin or proton density ($\rho$), as well as experiment-specific parameters, such as off-resonance frequency. Advantageously, MRF provides a way to evaluate such parameters in a single, efficient imaging process. MRF is generally described in U.S. Pat. No. 8,723,518, which is herein incorporated by reference in its entirety.

Conventional MRF techniques vary the acquisition parameters from one repetition time ("TR") period to the next, often in a random or pseudo-random way which creates a time series of images with varying contrast. Examples of acquisition parameters that can be varied include flip angle, radio frequency ("RF") pulse phase, TR, echo time ("TE"), and k-space trajectories, such as by modifying one or more readout encoding gradients. The success of conventional MRF is largely due to the randomization of these parameters, which leads to both spatial and temporal incoherence of the encoding scheme but any scheme which creates a unique temporal pattern for different combinations of tissue parameters allows estimation of these parameters through the pattern matching process. More specifically, a sequence of randomized flip angles and repetition times (i.e., $\{(\alpha_m, TR_m)\}_{m=1}^M$) is used to generate a sequence of images ($\{I_m(x)\}_{m=1}^M$) with randomly varied contrast weightings, yielding incoherence in the temporal domain. Moreover, a set of highly undersampled k-space trajectories such as undersampled variable density spiral trajectories can be used to acquire k-space data, which yields spatial incoherence.

With these incoherently-sampled data, the conventional MRF reconstruction employs a simple template-matching procedure. Given a range of parameters of interest, the procedure uses a "dictionary" that contains all possible signal (or magnetization) evolutions simulated from the Bloch equation. That is, MRF matches an acquired magnetization signal to a pre-computed dictionary of signal models, or templates, that have been generated using Bloch equation-based physics simulations (i.e., Bloch simulations). As a general example, a template signal evolution is chosen from the dictionary if it yields the maximum correlation with the observed signal for each voxel (extracted from the gridding reconstructions). The parameters for the tissue or other material in a given voxel are estimated to be the values that provide the best signal template matching. That is, the reconstructed parameters are assigned as those that generate the selected template.

Although MRF has demonstrated great potential for revolutionizing MR parameter mapping, it does suffer from a number of key limitations. First, the accuracy of the resulting parameter maps depends critically on the length of data acquisition. Second, the accuracy of $T_2$ maps is often much worse than that for $T_1$ maps, especially when the acquisition time is short. Third, it is difficult for MRF to achieve high spatial resolution due to the limited SNR. The above observations clearly suggest that improving the SNR efficiency is of great importance to the design of MRF experiments.

In light of the foregoing, a need continues for systems and methods that advance the clinical ability to move toward quantitative imaging information, over qualitative imaging information.

SUMMARY

The present disclosure overcomes the aforementioned drawbacks by providing a system and method for improving signal-to-noise ratio (SNR) efficiency (signal to noise per unit imaging time of the resultant parameter map) of quantitative parameter estimation using magnetic resonance fingerprinting (MRF). For example, the present disclosure provides systems and methods to select MRF acquisition parameters such as flip angle (FA) or repetition time (TR) as a function of time when acquiring the time-series data used by MRF. More particularly, a theoretical bound on the variance of unbiased parameter estimates is used as a quality measure to assess and choose desired imaging parameters to improve the SNR efficiency of the MRF result.

In accordance with one aspect of the disclosure, a method is provided for acquiring magnetic resonance fingerprinting (MRF) imaging data from a subject using a magnetic resonance imaging (MRI) system. The method includes receiving an indication of an MRF imaging process to be performed by the MRI system and receiving a desired design objective for the MRF imaging process and a configuration metric associated with the MRF imaging process. The method also includes using the configuration metric to bound a variance of tissue parameter estimates associated with the MRF imaging process and determining imaging parameters that achieve the desired design objective. The method also includes performing the MRF imaging process using the determined imaging parameters to acquire MRF data using the MRI system.

In accordance with one aspect of the disclosure, a magnetic resonance imaging (MRI) system is provided that includes a magnet system configured to generate a polarizing magnetic field about at least a portion of a subject arranged in the MRI system and a plurality of gradient coils configured to apply a gradient field to the polarizing magnetic field. The MRI system also includes a radio frequency (RF) system configured to apply an excitation field to the subject and acquire MR image data from a region of interest (ROI). The MRI system also includes a computer system, which is programmed to receive an indication of an MRF imaging process to be performed by the MRI system and receive a desired design objective for the MRF imaging process and a configuration metric associated with the MRF imaging process. The computer system is further configured to use the configuration metric to bound a variance of tissue parameter estimates associated with the MRF imaging process to determine imaging parameters that achieve the desired design objective. The computer system is also configured to control the plurality of gradient coils and the RF system using the determined imaging parameters to perform the MRF imaging process and acquire MRF data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

As described, magnetic resonance fingerprinting ("MRF") techniques use varying acquisition parameters between repetition times ("TRs") to create a time series of images with varying contrast. As will be described, the present disclosure provides an estimation-theoretic framework to select and/or optimize experiment design for MRF. For example, the Cramer-Rao bound ("CRB"), a theoretical bound on the variance of any unbiased parameter estimate, is utilized in a method for MRF process design as an optimality metric to evaluate and design MRF process. This provides a principled way of selecting acquisition parameters (e.g., flip angles, RF pulse phase, and repetition times, and the like) to achieve or balance various clinical goals, including maximizing SNR efficiency. Within this framework the experiment design problem can be mathematically formulated and then solved, for example, via stochastic optimization. As opposed to the conventional MRF experiment, which uses pseudorandom acquisition parameters, the systems and methods of the present disclosure allow for optimized MRF processes to be designed, for example, to yield substantial reductions in acquisition time, and substantial improvement of the estimation performance for the $T_2$ map, while maintaining similar accuracy level for the $T_1$ map. With much better SNR efficiency, the MRF process significantly enhances the practical utility of MRF for high-resolution quantitative MR imaging applications. The reduction in imaging time further makes the design of MRF process more robust to motion. This experiment design framework also provides a powerful tool for high-field MRF, for example, including field strengths of 7T or even greater. Given that the 180 degree inversion pulse is often inaccurate in this scenario, an upper limit of inverse pulse can be incorporated into the experiment design problem to achieve desired performance.

Figure 1:
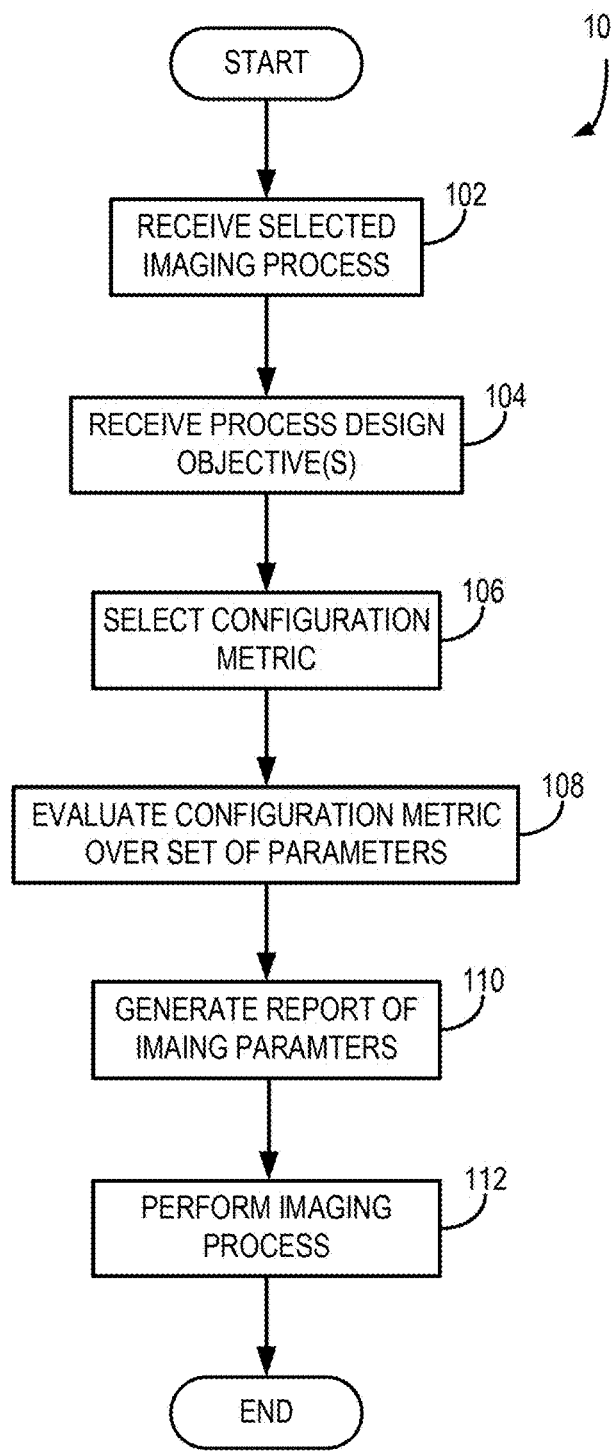
FIG. 1 is a flowchart setting forth an example of steps of magnetic resonance fingerprinting (MRF) method in accordance with the present disclosure.

Referring to FIG. 1, a flow chart is provided that illustrates some examples of steps of a process 100 for designing an MRI or, more particularly, MRF imaging process in accordance with the present disclosure. The process 100 starts at process block 102 with the receipt of a proposed MR imaging process that is desired by a user. For example, at process block 102, the user may select, as a non-limiting example, an MRF process. As described, an MRF process enables quantitative mapping of tissue or other material properties based on random or pseudorandom measurements of the subject or object being imaged. To this end, the selected imaging process is designed for simultaneous acquisition of multiple tissue-specific parameters and system-specific parameters that may include longitudinal relaxation time ($T_1$), transverse relaxation time ($T_2$), and spin or proton density ($\rho$), as well as experiment-specific parameters, such as off-resonance frequency. However, there is a great amount of variability in the specifics for performing a given acquisition, which may provide tradeoffs in acquisition speed, SNR efficiency, and the like. As will be described, the present disclosure provides systems and methods for determining acquisition parameters and/or designing a pulse sequence that balances these tradeoffs to, for example, improve or even maximize SNR efficiency or other designed parameters.

To this end, at process block 104, a selected objective for process design may be received. For example, a user may communicate a selected objective of maximizing SNR efficiency during the performance of the imaging process selected at process block 102.

At process block 106, a configuration metric may be selected. For example, a theoretical lower bound on the variance of any unbiased tissue parameter estimate associated with the selected MRI process from process block 102 and objective(s) at process block 104 is applied. As one non-limiting example, a Cramer-Rao bound (CRB) may be used as the configuration metric.

As a non-limiting example, consider an MRI signal from a given area of tissue to be an MRF tissue parameter that is a function of the constituent MR properties of the given area of tissue, such that $\theta=[T_1,T_2,M_0,F_0]^T$. Based on estimation theory, the CRB matrix $C(\theta)$ for any unbiased estimator $\hat{\theta}$ can be expressed as:

$$E[(\theta-\hat{\theta})(\theta-\hat{\theta})^T] \geq C(\theta) = J^+(\theta) \qquad \text{Eqn. 1}$$

where $J(\theta)$ denotes the Fisher information matrix that can be calculated as:

$$J_{i,j} = \frac{1}{\sigma^2}\sum_{n=1}^{N}\left[\frac{\partial m^n(\theta)}{\partial \theta_i}\right]^T\left[\frac{\partial m^n(\theta)}{\partial \theta_j}\right]; \qquad \text{Eqn. 2}$$

where $\sigma^2$ denotes the noise variance, $m^n$ is the magnetization evolution at the n th TR, + denotes the pseudo-inverse, and N is the length of acquisition. Given that the CRB bounds the estimation variance, it can be used to evaluate a desired design objective, such as the SNR efficiency, of the proposed MR imaging process provided at process block 102. As a non-limiting example, with the CRB, the problem of designing MRF imaging parameters can be formulated as:

$$\min_{\alpha_n,TR_n} \sum_{l=1}^{L}\sum_{i=1}^{4} \omega_i \sqrt{[C(\theta^{(l)})]_{i,i}}/\theta_i^{(l)} \qquad \text{Eqn. 3}$$

s.t.

$$\alpha_n^{min} \leq \alpha_n \leq \alpha_n^{max}, TR_n^{min} \leq TR_n \leq \alpha_n^{max}, \sum_{n=1}^{N}TR_n \leq T;$$

where $\alpha_n^{min}$ and $\alpha_n^{max}$ respectively denote the upper and lower limits of the nth flip angle, $TR_n^{min}$ and $TR_n^{max}$ respectively denote the upper and lower limits on the nth TR, T denotes the total acquisition time, and $\omega_i$ balances the importance of different parameters for experiment design. To this end, at process block 108, the configuration metric of process block 106, which in this example is the CRB, can be evaluated or optimized over a set of representative tissue parameters $\{\theta^{(l)}\}_{l=1}^{L}$. Note, this formulation results in a highly non-linear and non-convex optimization problem. As a non-limiting example, stochastic optimization can be applied to obtain a desirable local minimum. In this case, once a desirable stopping criteria is reached, such as a desirable local minimum, imaging parameters (e.g., RF pulse phase, flip angles, repetition times) for the selected imaging process based on the design objectives are communicated at process block 110. Then, at process block 112, an imaging process, such as an MRF process, can be performed based on the imaging parameters from process block 110. Thus, in the non-limiting example provided above, an MRF process may be designed that optimizes SNR efficiency.

In one non-limiting example of implementing the above-described process, the CRB was used to analyze an existing MRF acquisition. The representative tissue parameter values were chosen from the grey matter and white matter of the brain, and the CRB was calculated based on the same flip angles and repetition times (TR) used in the prior acquisition. In particular, these values were taken from D. Ma, V. Gulani, N. Seiberlich, K. Liu, J. L. Sunshine, J. L. Duerk, and M. A. Griswold, "Magnetic resonance fingerprinting", Nature, vol. 495, pp. 187-192, 2013, which is incorporated herein by reference in its entirety.

Figure 2A:
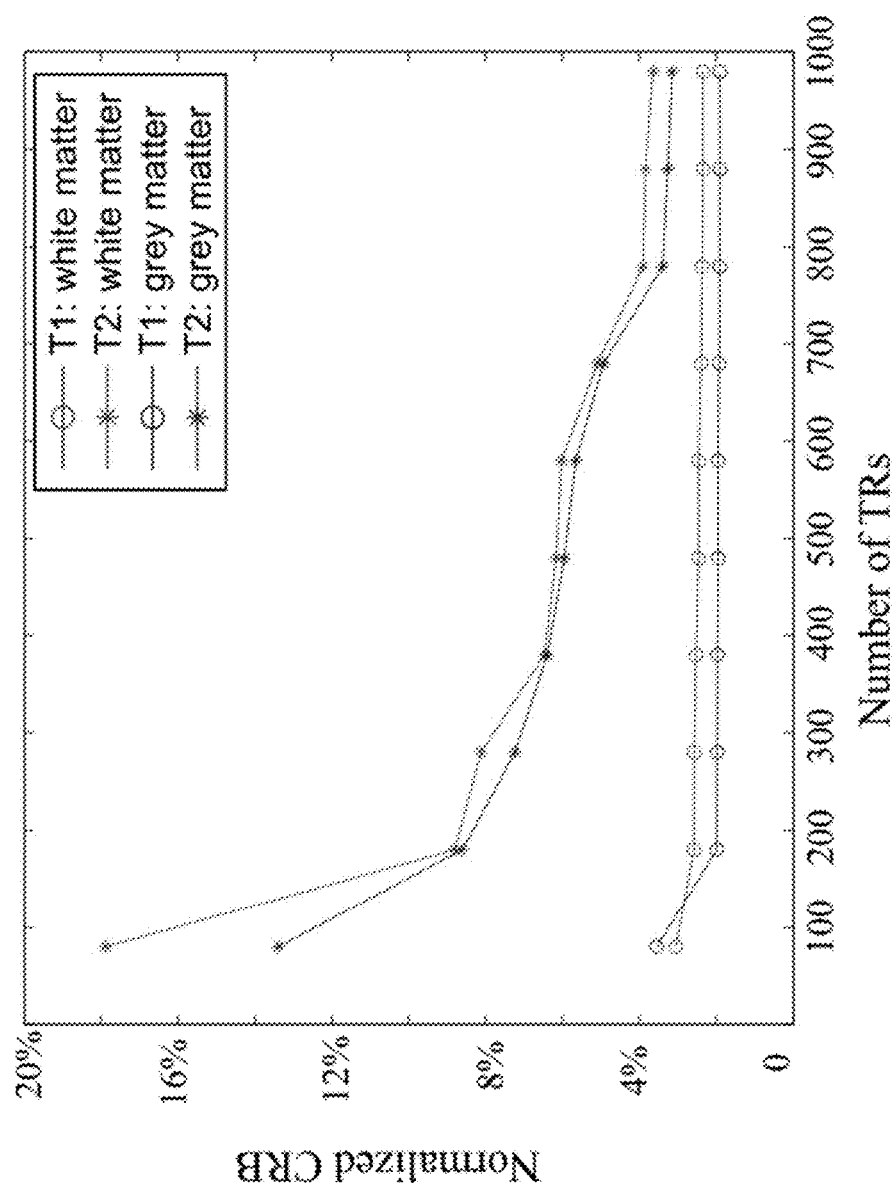
FIG. 2A is a graph showing normalized Cramer-Rao bound (CRB) versus acquisition length for $T_1$ and $T_2$ gray matter and white matter.

FIG. 2A is a graph of the normalized CRB versus the number of TRs (i.e., acquisition time). As illustrated, the CRB for $T_2$ is much larger than that of $T_1$ for both tissues, confirming the empirical observations made in known studies, such as B. Zhao, F. Lam, B. Bilgic, H. Ye, K. Setsompop, "Maximum likelihood reconstruction for magnetic resonance fingerprinting", pp. 905-909, IEEE Int. Symp. Biomed Imaging, 2015. and E. Y. Pierre, D. Ma, Y. Chen, C. Badve, and M. A. Griswold, "Multiscale Reconstruction for MR Fingerpriting:, Magn. Reson. Med., 2015, in press, each of which is incorporated herein by reference in its entirety. As illustrated, the $T_1$ estimation accuracy rapidly reaches the minimum within the first 200 TRs, while attaining good accuracy for $T_2$ requires significantly longer acquisition time. Thus, FIG. 2A clearly indicates that the original MRF experiment is sub-optimal, because 1) if $T_1$ contrast is a priority, there is no gain in estimation quality for using a longer experiment, and 2) if $T_2$ contrast is the priority, the process is not efficient. Using the above-described process, an imaging design would be determined that addresses both of these issues.

In particular, an imaging process design using the above-described process can use the CRB to maximize the SNR efficiency for $T_1$ and $T_2$. To this end, the maximum and minimum flip angles were set as 0 and 60 degree, the maximum and minimum TRs were set as 8 ms and 11 ms, and the experiment duration was set as T=5 s. To evaluate the effectiveness of this parameter set, the MRF acquisitions were performed using the original acquisition parameters and the parameters determined based on the above-process for the design objective of increasing SNR efficiency with the same acquisition time T=5 s. Furthermore, the original MRF imaging process was performed with the acquisition time of T=10 s.

Figure 2B:
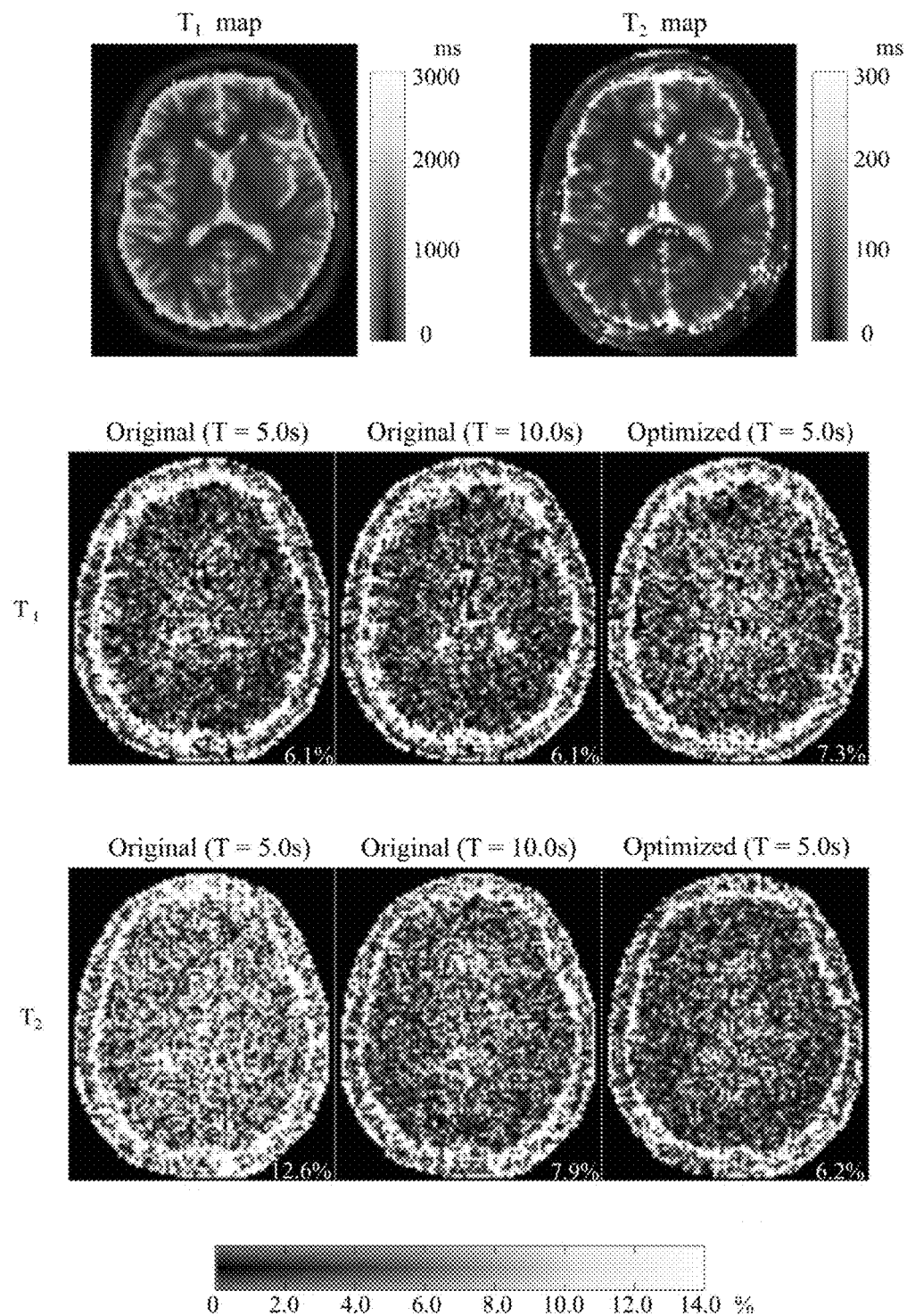
FIG. 2B is a collection of error maps associated with the maximum likelihood reconstructions from the data obtained using the conventional MRF acquisition parameters and optimized acquisition parameters, respectively.

FIG. 2B is a set of images that show the error maps associated with the $T_1$- and $T_2$-weighted reconstructions using the maximum likelihood (ML) reconstruction approach, such as described in B. Zhao, F. Lam, B. Bilgic, H. Ye, K. Setsompop, "Maximum likelihood reconstruction for magnetic resonance fingerprinting", pp. 905-909, IEEE Int. Symp. Biomed Imaging, 2015 and co-pending U.S. Provisional Application Ser. No. 62/280,891, filed Jan. 20, 2016, which is incorporated herein by reference in its entirety.

As can be seen in FIG. 2B, compared to the original MRF imaging process with the same acquisition time (i.e., T=5 s), the imaging process with imaging parameters selected in accordance with the present disclosure is able to achieve a similar level of accuracy for the $T_1$ estimation, while providing substantial improvement in the $T_2$ estimation accuracy. Compared to the results achieved with the original MRI imaging process with T=10 s, an optimized imaging process using imaging parameters selected in accordance with the present disclosure provides better $T_2$ accuracy while simultaneously reducing experiment duration. This clearly indicates the improvement of SNR efficiency offered by the systems and methods provided herein.

Thus, FIGS. 2A and 2B illustrate the effectiveness of a principled framework provided herein based on the CRB to evaluate and design MRI and, more particularly, MRF imaging processes. An MRF process designed with imaging parameters determined as described above allows for substantial improvement in the accuracy of the $T_2$ estimation, while maintaining similar level of accuracy for the $T_1$ estimation. With an imaging process designed in accordance with the present disclosure, there is the ability to gain improvements in SNR efficiency up to a factor of two or more. That is, with the CRB, the selection of the imaging acquisition parameters (e.g., RF pulse phase, flip angles; repetition times) can be made based on desired clinical objectives, such as to maximize the SNR efficiency of quantitative parameter estimation, as one non-limiting example. Such optimized experiments can allow for a factor of two or more improvement of SNR efficiency compared to the conventional MRF experiments. In addition to improving imaging acquisition design, the systems and methods provided herein provide a powerful tool to design MRF experiments using high-fields (e.g., 3T, 7T, and above), since various types of imperfections (e.g., inaccurate 180 degree inversion pulse) can be readily incorporated into the experiment design problem.

Figure 3:
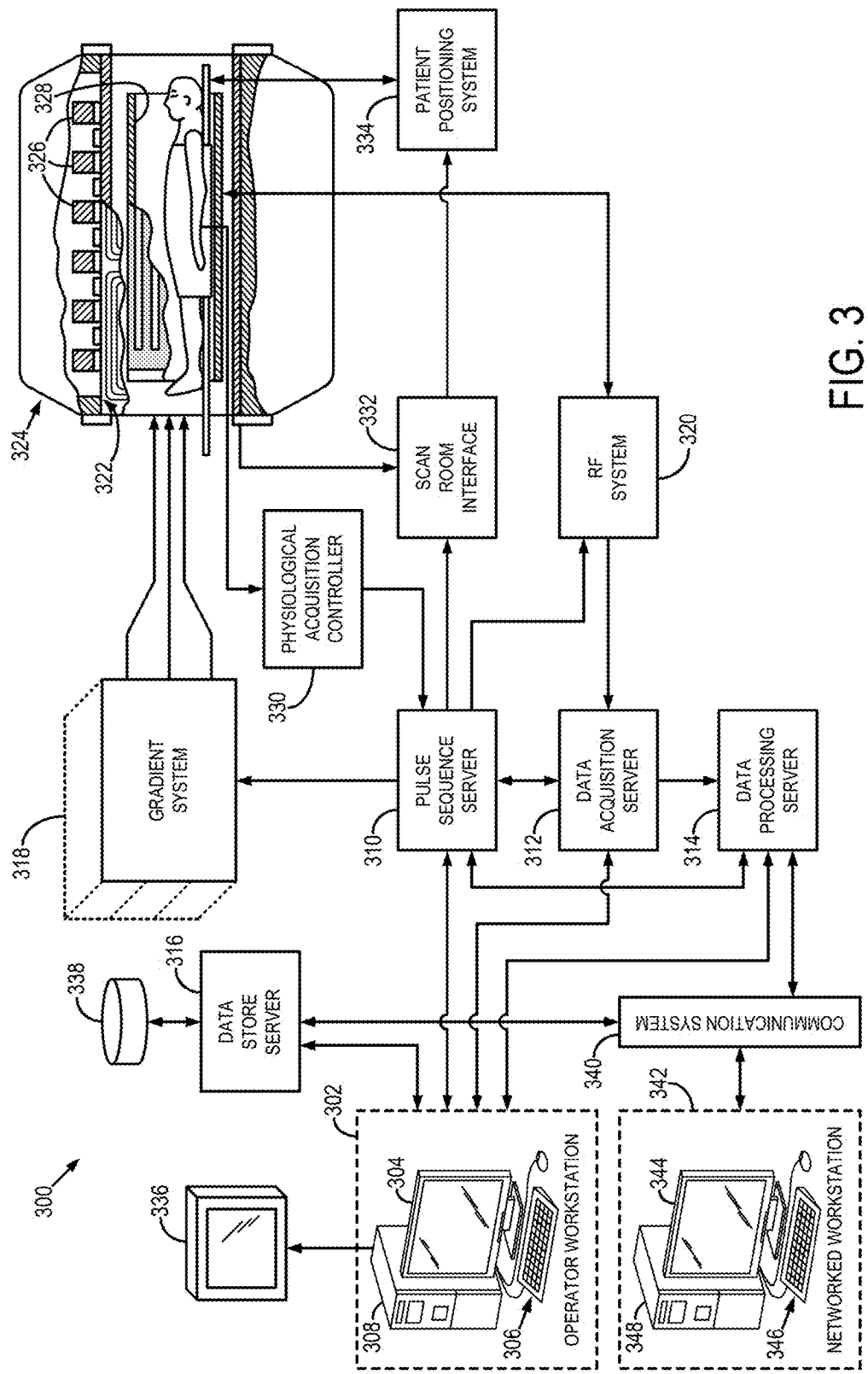
FIG. 3 is a block diagram of an example of a magnetic resonance imaging ("MRI") system configured for use in accordance with the present disclosure.

Referring now to FIG. 3, the above-described systems and methods may be implemented using or designed to accompany a magnetic resonance imaging ("MRI") system 300, such as is illustrated in FIG. 3. The MRI system 300 includes an operator workstation 302, which will typically include a display 304, one or more input devices 306 (such as a keyboard and mouse or the like), and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to multiple servers, including a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms to perform the prescribed scan are produced and applied to the gradient system 318, which excites gradient coils in an assembly 322 to produce the magnetic field gradients $G_x$, $G_y$, $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil, are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad \text{Eqn. 24;}$$

and the phase of the received magnetic resonance signal may also be determined according to the following relationship:

$$\varphi = \tan^{-1}\left(\frac{Q}{I}\right). \quad \text{Eqn. 25}$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 314 are conveyed back to the operator workstation 302. Images may be output to operator display 312 or a display 336 that is located near the magnet assembly 324 for use by attending clinician. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344, one or more input devices 346 (such as a keyboard and mouse or the like), and a processor 348. The networked workstation 342 may be located within the same facility as the operator workstation 302, or in a different facility, such as a different healthcare institution or clinic. The networked workstation 342 may include a mobile device, including phones or tablets.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

Figure 4:
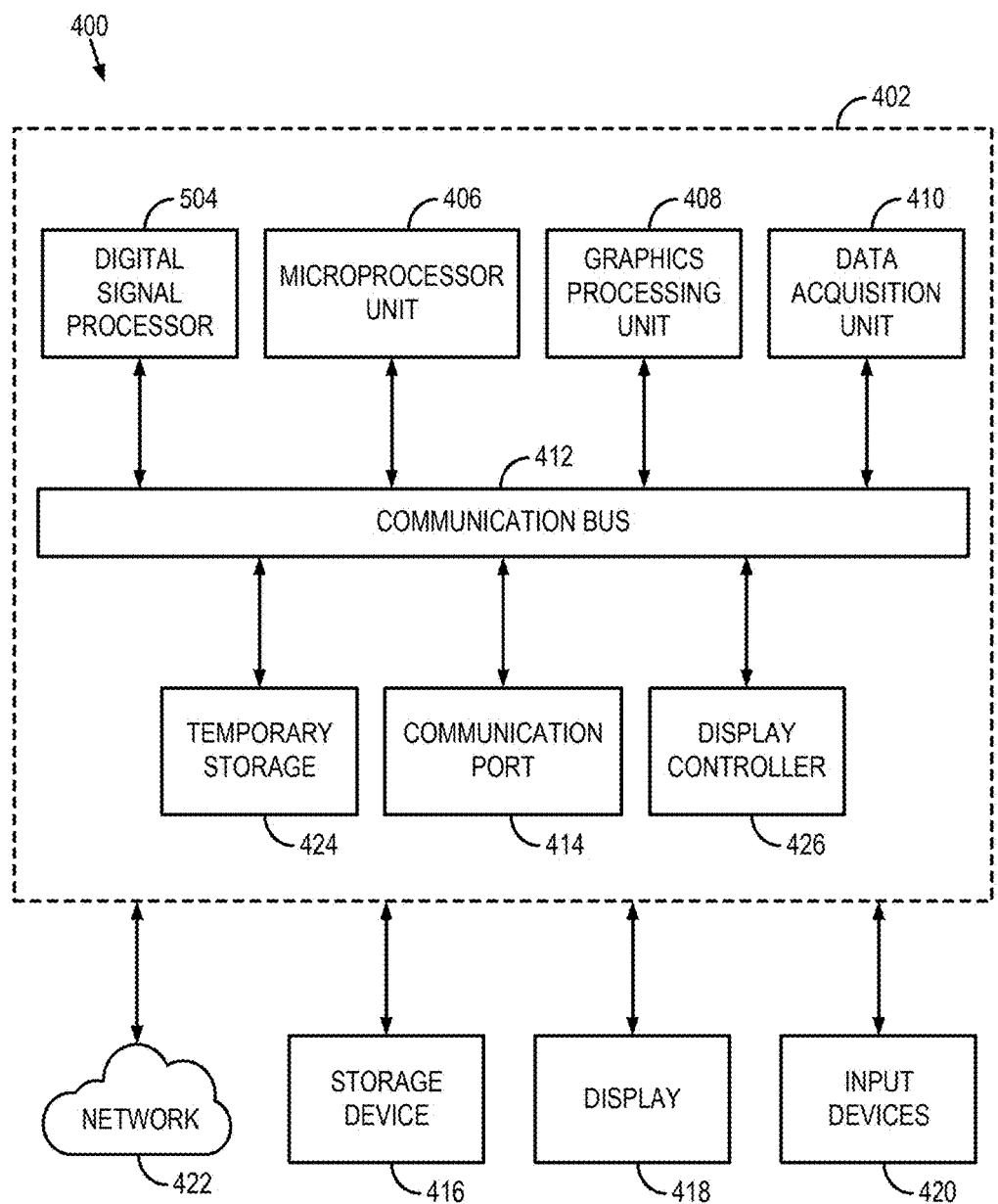
FIG. 4 is a block diagram of an example computer system that can be configured to implement the methods described herein.

Beyond the above-described MRI system, the systems and methods described herein may be performed using a computer system that is separate from an MRI system that is used to acquire imaging or MRF data. Referring now to FIG. 4, a block diagram of an example computer system 400 that can be configured to reconstruct magnetic resonance images using, for example, a ML-MRF reconstruction process, as described above, is illustrated. The data from which the magnetic resonance images are reconstructed can be provided to the computer system 400 from the respective MRI system and received in a processing unit 402.

In some configurations, the processing unit 402 can include one or more processors. As an example, the processing unit 402 may include one or more of a digital signal processor ("DSP") 404, a microprocessor unit ("MPU") 406, and a graphics processing unit ("GPU") 408. The processing unit 402 can also include a data acquisition unit 410 that is configured to electronically receive data to be processed, which may include magnetic resonance image data. The DSP 404, MPU 406, GPU 408, and data acquisition unit 410 are all coupled to a communication bus 412. As an example, the communication bus 412 can be a group of wires, or a hardwire used for switching data between the peripherals or between any component in the processing unit 402.

The DSP 404 can be configured to receive and processes the magnetic resonance data or reconstructed magnetic resonance images. The MPU 406 and GPU 408 can also be configured to process the magnetic resonance data or reconstructed magnetic resonance images in conjunction with the DSP 404. As an example, the MPU 406 can be configured to control the operation of components in the processing unit 402 and can include instructions to perform reconstruction of the magnetic resonance image data on the DSP 404. Also as an example, the GPU 408 can process image graphics.

In some configurations, the DSP 404 can be configured to process the magnetic resonance image data received by the processing unit 402 in accordance with the techniques described above. Thus, the DSP 404 can be configured to reconstruct magnetic resonance images or MRF images using the described above ML-MRF process.

The processing unit 402 preferably includes a communication port 414 in electronic communication with other devices, which may include a storage device 416, a display 418, and one or more input devices 420. Examples of an input device 420 include, but are not limited to, a keyboard, a mouse, and a touch screen through which a user can provide an input.

The storage device 416 is configured to store images, whether provided to or processed by the processing unit 402. The display 418 is used to display images, such as images that may be stored in the storage device 416, and other information. Thus, in some configurations, the storage device 416 and the display 418 can be used for displaying reconstructed magnetic resonance images.

The processing unit 402 can also be in electronic communication with a network 422 to transmit and receive data, including CT images, MR images, and other information. The communication port 414 can also be coupled to the processing unit 402 through a switched central resource, for example the communication bus 412.

The processing unit 402 can also include a temporary storage 424 and a display controller 426. As an example, the temporary storage 424 can store temporary information. For instance, the temporary storage 424 can be a random access memory.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for acquiring magnetic resonance fingerprinting (MRF) imaging data from a subject using a magnetic resonance imaging (MRI) system, the steps of the method comprising:
   receiving an indication of an MRF imaging process to be performed by the MRI system;
   receiving a desired design objective for the MRF imaging process and a configuration metric associated with the MRF imaging process;
   using the configuration metric to bound a variance of tissue parameter estimates associated with the MRF imaging process, determining imaging parameters that achieve the desired design objective; and
   performing the MRF imaging process using the determined imaging parameters to acquire MRF data using the MRI system.

2. The method of claim 1 wherein the configuration metric includes a theoretical lower bound.

3. The method of claim 2 wherein the theoretical lower bound is a Cramer-Rao bound (CRB).

4. The method of claim 1 wherein the MRI system is used to acquire an MRI signal from a given area of tissue of the subject to determine an MRF tissue parameter that is a function of the constituent MR properties of the given area of tissue.

5. The method of claim 1 wherein the desired design object includes signal-to-noise ratio (SNR) efficiency of the MRF imaging process.

6. The method of claim 1 wherein determining imaging parameters includes evaluating:

$$\min_{\alpha_n, TR_n} \sum_{l=1}^{L} \sum_{i=1}^{4} \omega_i \sqrt{[C(\theta^{(l)})]_{i,i}} / \theta_i^{(l)}$$

s.t.

$$\alpha_n^{min} \le \alpha_n \le \alpha_n^{max}, TR_n^{min} \le TR_n \le \alpha_n^{max}, \sum_{n=1}^{N} TR_n \le T$$

where $\alpha_n^{min}$ and $\alpha_n^{max}$ respectively denote upper and lower limits of an nth flip angle in the MRF imaging process, $TR_n^{min}$ and $TR_n^{max}$ respectively denote upper and lower limits on an nth repetition time (TR) of the MRF imaging process, T denotes a total acquisition time of the MRF imaging process, and $\omega_i$ balances a relative importance of variance of tissue parameter estimates.

7. The method of claim 1 wherein determining imaging parameters that achieve the desired design objective includes evaluating the configuration metric over a set of representative tissue parameters.

8. The method of claim 1 further comprising applying a stochastic optimization to obtain a desirable local minimum indicating imaging parameters that achieve the desired design objective.

9. The method of claim 1 wherein the imaging parameters that achieve the desired design objective include radio frequency (RF) pulse phase, flip angles, or repetition time (TR), and k-space trajectories.

10. A magnetic resonance imaging (MRI) system comprising:
    a magnet system configured to generate a polarizing magnetic field about at least a portion of a subject arranged in the MRI system;
    a plurality of gradient coils configured to apply a gradient field to the polarizing magnetic field;
    a radio frequency (RF) system configured to apply an excitation field to the subject and acquire MR image data from a ROI;
    a computer system programmed to:
      receive an indication of an MRF imaging process to be performed by the MRI system;
      receive a desired design objective for the MRF imaging process and a configuration metric associated with the MRF imaging process;
      use the configuration metric to bound a variance of tissue parameter estimates associated with the MRF imaging process to determine imaging parameters that achieve the desired design objective; and
      control the plurality of gradient coils and the RF system using the determined imaging parameters to perform the MRF imaging process and acquire MRF data.

11. The system of claim 9 wherein the configuration metric includes a theoretical lower bound.

12. The system of claim 11 wherein the theoretical lower bound is a Cramer-Rao bound (CRB).

13. The system of claim 10 wherein, to perform the MRF imaging process, the computer system is further programmed to acquire an MRI signal from a given area of tissue of the subject to determine an MRF tissue parameter that is a function of the constituent MR properties of the given area of tissue.

14. The system of claim 10 wherein the desired design object includes signal-to-noise ratio (SNR) efficiency of the MRF imaging process.

15. The method of claim 10 wherein, to determine imaging parameters, the computer system is further programmed to evaluate:

$$\min_{\alpha_n, TR_n} \sum_{l=1}^{L} \sum_{i=1}^{4} \omega_i \sqrt{[C(\theta^{(l)})]_{i,i}} / \theta_i^{(l)}$$

s.t.

$$\alpha_n^{min} \le \alpha_n \le \alpha_n^{max}, TR_n^{min} \le TR_n \le \alpha_n^{max}, \sum_{n=1}^{N} TR_n \le T$$

where $\alpha_n^{min}$ and $\alpha_n^{max}$ respectively denote upper and lower limits of an nth flip angle in the MRF imaging process, $TR_n^{min}$ and $TR_n^{max}$ respectively denote upper and lower limits on an nth repetition time (TR) of the MRF imaging process, T denotes a total acquisition time of the MRF imaging process, and $\omega_i$ balances a relative importance of variance of tissue parameter estimates.

16. The system of claim 10 wherein to determine imaging parameters that achieve the desired design objective, the computer system is further programmed to evaluate the configuration metric over a set of representative tissue parameters.

17. The system of claim 10 wherein the computer system is further programmed to apply a stochastic optimization to obtain a desirable local minimum indicating imaging parameters that achieve the desired design objective.

18. The system of claim 17 wherein the imaging parameters that achieve the desired design objective include radio frequency (RF) pulse phase, flip angles, repetition time (TR), or k-space trajectories.

* * * * *